United States Patent [19]

Miller et al.

[11] Patent Number: 5,581,564
[45] Date of Patent: Dec. 3, 1996

[54] DIAGNOSTIC CIRCUIT

[75] Inventors: Michael J. Miller, Saratoga; John R. Mick, Los Altos Hills, both of Calif.

[73] Assignee: Integrated Device Technology, Inc., Santa Clara, Calif.

[21] Appl. No.: 629,285

[22] Filed: Dec. 18, 1990

[51] Int. Cl.$^6$ .................................................. H04B 17/00
[52] U.S. Cl. ......................... 371/22.3; 371/22.1; 371/22.6
[58] Field of Search ................................. 371/22.3, 22.1, 371/22.6, 15.1

[56] References Cited

U.S. PATENT DOCUMENTS

| | | | |
|---|---|---|---|
| 4,488,259 | 12/1984 | Mercy | 364/900 |
| 4,597,042 | 6/1986 | d'Angeac et al. | 364/200 |
| 4,710,927 | 12/1987 | Miller | 371/22.1 |
| 4,947,357 | 8/1990 | Stewart et al. | 371/22.3 |
| 4,975,641 | 12/1990 | Tanaka et al. | 324/158 R |
| 5,062,110 | 10/1991 | Kobayashi et al. | 371/22.3 |
| 5,130,989 | 7/1992 | Anderson et al. | 371/22.3 |

*Primary Examiner*—Robert W. Beausoliel, Jr.
*Assistant Examiner*—Ly V. Hua
*Attorney, Agent, or Firm*—Skjerven, Morrill, MacPherson, Franklin & Friel

[57] ABSTRACT

A diagnostic circuit of the present invention has serial command input and output pins separate from its serial data input and output pins. In one embodiment, the diagnostic circuit has one command register and one data register, the data register receiving serially an input signal and providing serially an output signal through an input pin and an output pin respectively. In another embodiment, the diagnostic circuit has one command register and multiple data registers. Each data register including a zero-length register, can be separately addressed. In yet another embodiment, multiple serial data input and output pins are provided together with multiple data registers.

2 Claims, 4 Drawing Sheets

DIAGNOSTIC CIRCUIT

BACKGROUND OF THE INVENTION

1. Field of the Invention

This invention relates to testing of digital systems. In particular, this invention relates to in-circuit testing of digital systems.

2. Description of Related Art

Many in-circuit testing techniques have been proposed over the years. One such technique is the Level Sensitive Scan Design (LSSD) technique. Under LSSD, memory elements, such as registers or flip-flops, are serially connected to form a "scan-path," for scanning in test data and scanning out test results. At the integrated circuit level, a typical scan path begins at an input pin of the integrated circuit and ends at an output pin of the integrated circuit. Typically, a clock signal controls the shifting of data along the scan path. The test data, which is provided at the rate of one bit per clock cycle, allows the user to initialize the integrated circuit to a known state, to command the circuit to execute the functions under test, and to probe the resulting states of the circuit or resulting data for diagnostic purposes. An example of a test structure using the LSSD technique can be found in U.S. Pat. No. 4,488,259 by Brian R. Mercy, assigned to IBM Corporation entitled "On Chip Monitor", filed Oct. 29, 1982, issued Dec. 11, 1984.

As the complexity of digital systems grows, providing control to the test structure increases the flexibility of the test structure and increases control over in the scan path. One technique includes a command register in the test structure, in order to implement a set of commands to the test structure for greater control over the test sequence and test data flow. In such a test structure, in addition to the serial input pin, the serial output pin and the clock input pin, a command/data pin is provided to steer the serial input signal to either the command register or the data (scan) register and to steer the command or test data output signal to the serial output pin. Further, it is desirable to provide scan paths across chip boundaries. By providing scan paths across chip boundaries, not only can each chip be tested individually, the multi-chip digital system can tested as a whole.

Command and data multiplexing in the serial data input and the serial data output pins minimizes the number of dedicated pins used by the test structure. An example of such test structure is found in U.S. Pat. No. 4,710,927, by Michael J. Miller, filed Jul. 24, 1986 and issued Dec. 1, 1987.

However, multiplexing commands and test data on the same serial input and output pins is time-consuming and restricts the chips under test to be connected serially. Serial connections are inefficient because, if the same command is directed to each of the test structures in a scan path, the command must be repeated for each test structure, and the command for each test structure must scan through all preceding test structures in the scan path.

SUMMARY OF THE INVENTION

In accordance with the present invention, a diagnostic circuit having separate serial command and data scan paths is provided.

In one embodiment, the diagnostic circuit has one command and one data register. In this embodiment, a serial command or a serial data signal is received and output through an input pin and an output pin respectively.

In another embodiment, the diagnostic circuit has one command register and multiple data registers. In this embodiment, each data register can be separately addressed. Such registers can include a zero-length register. Multiple data registers store intermediate results and provide a means to measure circuit speed. A zero-length register allows bypassing.

In another embodiment, multiple serial data input and output pins are provided. In this embodiment, multiple scan paths within a chip can be loaded simultaneously.

DETAILED DESCRIPTION OF THE PREFERRED EMBODIMENTS

Figure 1:
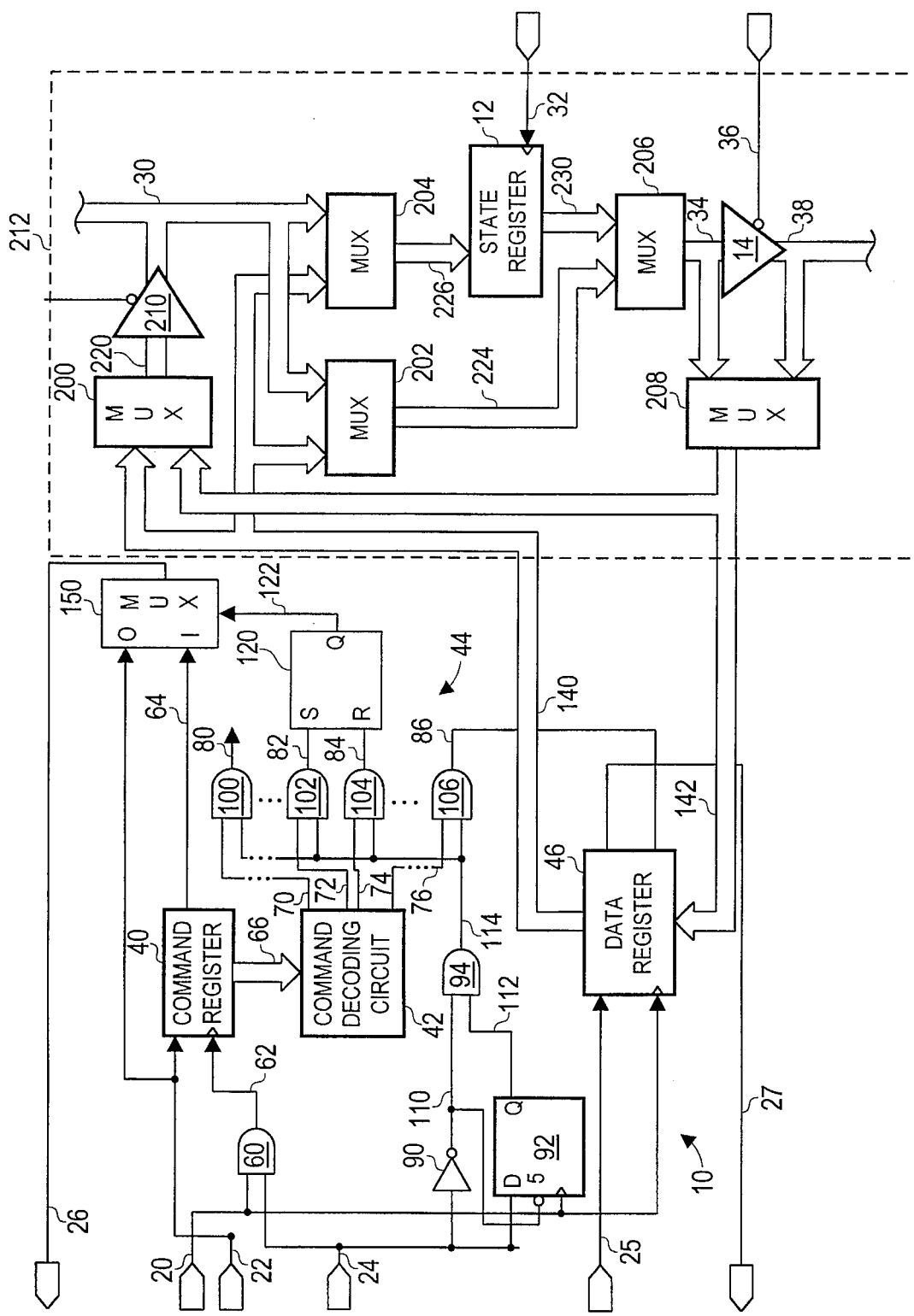
FIG. 1 shows an embodiment in accordance with the present invention using one serial command input pin, one serial data input pin, one serial command output pin, and one serial data output pin.

FIG. 1 shows an embodiment of the present invention using one serial command input pin, one serial data input pin, one serial command output pin and one serial data output pin. The circuit under test is represented by the circuit labelled 212, which includes the state register 12, buffers 14 and 210, and multiplexers 200, 202, 204, 206 and 208.

In this embodiment shown in FIG. 1, the diagnostic circuit 10 receives a serial data input signal on lead 25, which is connected to an input pin, and provides a serial data output signal on lead 27, which is connected to an output pin. Commands for the diagnostic circuit 10 are received on an input pin as a serial command signal on lead 22 and, after shifting through the command register 40, output as a serial command output signal on lead 26 to an output pin. A clock signal is received through an input pin on lead 20 to provide a clocking scheme for the test structure. A command ready/execute signal is provided through an input pin on lead 24 to enable the execution of the test command.

Under normal operation, input data for the circuit under test 212 is provided on bus 30 through multiplexer 204 to the input terminals of state register 12 on bus 226. The state register 12 also receives a system clock signal on lead 32. The output signals of the state register 12 are provided on bus 230, which is routed through multiplexer 206 to provide the signals of bus 230 onto bus 34. The tri-state buffers 14 are enabled under normal operations, so that the output signals of state register 12 on bus 34 are provided on bus 38 to other circuits receiving the output signals of state register 12. The diagnostic circuit 10 in this embodiment comprises a command register 40, decoding circuit 42, command strobe circuit 44 and data register 46.

Command register 40 receives, through an input pin on lead 20 and an AND gate 60, a test clock signal on lead 62 for shifting the serial test commands on lead 22 into the command register 40 and for shifting out test commands on lead 64. Command register 40 also outputs its content in a parallel format on bus 66.

Decoding circuit 42 is implemented according to the control requirements of the circuit under test. For simple applications, the signals of the command in command register 40 can be used as input to the circuit under test (i.e. state register 12). In that case, bus 66 can be directly connected to the circuit under test. One disadvantage in this scheme occurs where some of the signals in the control are bidirectional. In that case, bus contention may result. Also is well known, such implementation is not suitable for controlling registers in a control path, particularly when some command bit patterns are forbidden. This is because the forbidden conditions can be violated as commands are shifted into and out of the command register 40.

In the embodiment shown in FIG. 1, the decoding circuit 42 receives its input signals from bus 66 and provides a number of decoded output signals represented by leads 70 to 76. Some of the output signals can be used directly as control signals, other output signals are combined by gates to derive specific control signals. Specific examples of these output signals will be discussed below.

Command strobe circuit 44 couples the control signals represented by lead 70 to 76 onto leads 80 to 86 during the period when the command ready/execution signal on lead 24 is at logic low. For this purpose, command strobe circuit 44 includes an inverter 90, a D flip-flop 92 having a set terminal S for setting output Q to logic high when the signal at the S terminal transitions to logic low, a 2-input AND gate 94, and an additional number of AND gates represented by AND gates 100 to 106. As shown in FIG. 1, AND gate 94 enables AND gates 100 to 106 only when the command ready/ execution signal on lead 24 is at logic low.

As an example of the decoded signals 80–86 being used as control signals, leads 84 and 82 are shown to be connected to a RS flip-flop 120 at its R and S inputs respectively. This RS flip-flop 120 is also an example of the use of the command in command register 40 to modify data transfer in the test structure, since RS flip-flop 120 controls whether the command being input is provided to the serial command output. The Q output signal of RS flip-flop 120 is provided to the select input of multiplexer 150 for selecting either the command input signal on lead 22 or the serial output signal of command register 40. The output signal of multiplexer 150 is provided on lead 26.

Data register 46 receives the clock input signal on lead 20, and a serial data input signal on lead 25, and provides a serial data output signal on lead 27. Data register 46 also receives parallel input signals from bus 142 and provides parallel output signals on bus 140. Data register 46 loads its parallel input signals from bus 142 when a load-enable signal is received on lead 86. This load enable signal is one of the control signals provided by the decoding circuit 44 and is synchronized with the logic low phase of the command ready/execute signal of lead 24.

Diagnostic circuit 10 can be cascaded with other diagnostic circuits. In a cascaded serial configuration, line 26 of one circuit is connected to line 22 of the next circuit to transmit the serial command signal from the serial command output pin of one circuit to the serial command input pin of the next circuit. Line 20 of all the diagnostic circuits are connected together to receive in parallel the test clock signal. Likewise, the input pins of all the diagnostic circuits for receiving the command ready/execution signal on line 24 are connected together. Line 27, which is connected to the serial data output pin, is connected to the serial data input pin on lead 25 of the next circuit.

Figure 2:
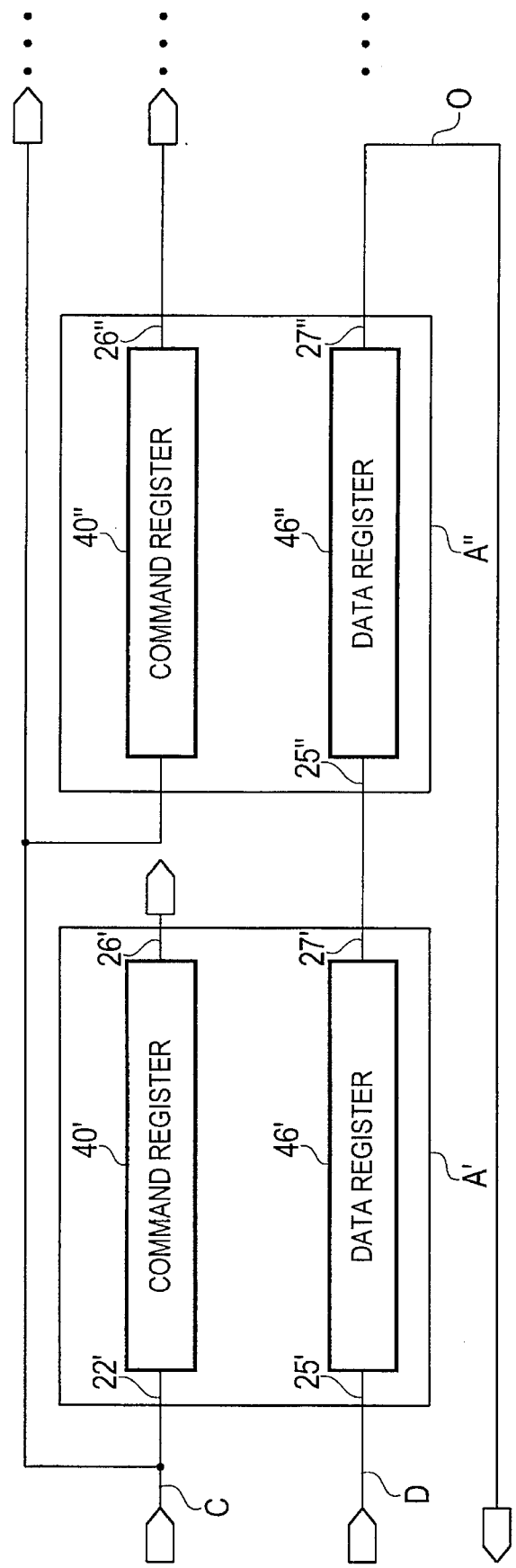
FIG. 2 shows a connection scheme ("stubbing") attained in accordance with the present invention not attainable in the prior art.

In addition, a configuration such as shown on FIG. 2 is also possible.

As shown in FIG. 2, two circuits A' and A" are shown to each contain a diagnostic circuit, such as diagnostic circuit 10 of FIG. 1. For the purpose of comparison, the components of each of these diagnostic circuits shown are given the same reference numerals as those shown in FIG. 1. In order to distinguish circuit A' from circuit A", reference numerals of circuit A' are suffixed by "'", and reference numerals of circuit A" are suffixed by "''".

In this configuration ("stubbing") shown in FIG. 2, command input signals are provided both circuits A' and A" on lead C. However, the data input signals are chained, i.e., a serial data input signal to circuit A" is first steered through circuit A'. The serial data is scanned out on lead O. This configuration is particularly advantageous when the circuit under the test are provided identical test sequences, even though each circuit is provided a different set of test data.

Referring again to FIG. 1: operationally, when the command ready/execution signal on lead 24 is at logic low, serial data on lead 25 is shifted into data register 46. When the number of bits remaining to be shifted into data register 46 equals the length of the command register 40, the command ready/execution signal on lead 24 is raised to logic high. This low-to-high transition of the command ready/execution signal on lead 24 signals that a test command is to be shifted serially into command register 40 on lead 22 simultaneously with the remaining bits of the serial data input signal to be shifted into data register 46. In this manner, both the serial command input signal on lead 20 and the serial data input signal on lead 25 complete shifting into command register 40 and data register 46, respectively, during the same clock cycle. Completion of command and data shifting is signaled by the command ready/execution signal on lead 24 transitioning to logic low. At that instant, the output control signals of decoding circuit 42 represented by leads 70 to 76 are coupled onto lead 80 through 86 to execute the command decoded by the command strobe circuit 44.

This circuit allows also repeated execution of the same command without having to shift the command into the command register again after every execution phase (i.e. command ready/execute signal at logic low). This is accomplished by the following sequence: first, the commands and data are shifted into the respective registers as discussed above. The command ready/execution signal then transitions to logic low, initiating a command execution phase as provided above. The next set of data is then shifted into the data register without correspondingly shifting the same command into command register 40 by holding the command ready/execute signal on lead 24 at logic low. When the shifting of data into data register 46 is complete, the clock on lead 20 is stopped and the command ready/execution signal is toggled to indicate the next execution phase using the new shifted data and the command from the previous execution phase. Alternatively, if the clock signal on lead 20 is stopped and the command ready/execution signal can be toggled for repeated execution for the same set of commands and data. This operation provides reuse of the same command and data patterns without the cost of reloading, which is useful in some testing applications.

The multiplexers 200, 202, 204, 206 and 208 facilitates the circuit under test (i.e., test circuit 212). Multiplexer 200 selects between the buses 140 and 142 and couples, when buffer 210 is enabled, the signals of the selected bus onto bus 30. Multiplexer 202 selects between buses 140 and 30 and couples the signals of the selected bus thereof onto bus 224.

Multiplexer 204 selects between buses 140 and 30 and couples the signals of the selected bus thereof onto bus 226, to provide the input signals to state register 12. Multiplexer 206 selects between buses 224 and 230 and couples the signals of the selected bus thereof onto bus 34. Multiplexer 208 selects between buses 34 and 38 and couples the signals of the selected bus thereof onto bus 142.

During testing, multiplexer 200 provides a feedback path for returning within the same clock cycle the output signals of state register 12 by way of bus 30 as the input signals of state register 12 on bus 226. Multiplexer 202 provides a means for loading the data on bus 30 or bus 140 into the data register 46 through multiplexers 206 and 208. Multiplexer 204 allows either the data on bus 140 or bus 30 to be provided to the input terminals of state register 12. Multiplexer 206 allows either the data of register 46 on bus 140 or the output data of state register 12 on bus 230 to be provided onto either bus 142 or bus 38. Multiplexer 208 routes one of the various output signal buses discussed above onto bus 142, which is the parallel data input of register 46.

Using the control signals provided by the decoding circuit 42, the following data transfer commands can be provided for this diagnostic circuit:

BUS 38 to Data register 46

Bus 34 to data register 46

Bus 38 to data register 46 (synchronous with the system clock 32)

Bus 38 to bus 30

Data for Register 46 to bus 38

Data register 46 to bus 30

Data register 46 to bus 226 bypass command register

Data register 46 to bus 38 (synchronous for system clock 32)

Bus 30 to bus 38

Other commands are, of course, possible. For example, if decoding circuit 42 includes a small microcode- or a hard-wire-controlled processor, with firmware to execute a built-in test sequence on the circuit under test, an "execute built-in test" command can be provided. Under this "execute built-in test" command, for example, command register 40 is loaded the "execute built-in test" command together with an address in the control memory of the processor inside decoding circuit 42. This address corresponds to the beginning of the built-in test sequence. Alternatively, if only one test sequence is available, this address need not be provided. Still further, such decoding circuit 42 can also include a state-machine capable of executing a test sequence designed to test the test structure itself. For example, when a sequence of all zeroes or any predetermined bit pattern is shifted into command register 40, a built-in test on the test structure is performed.

Figure 3:
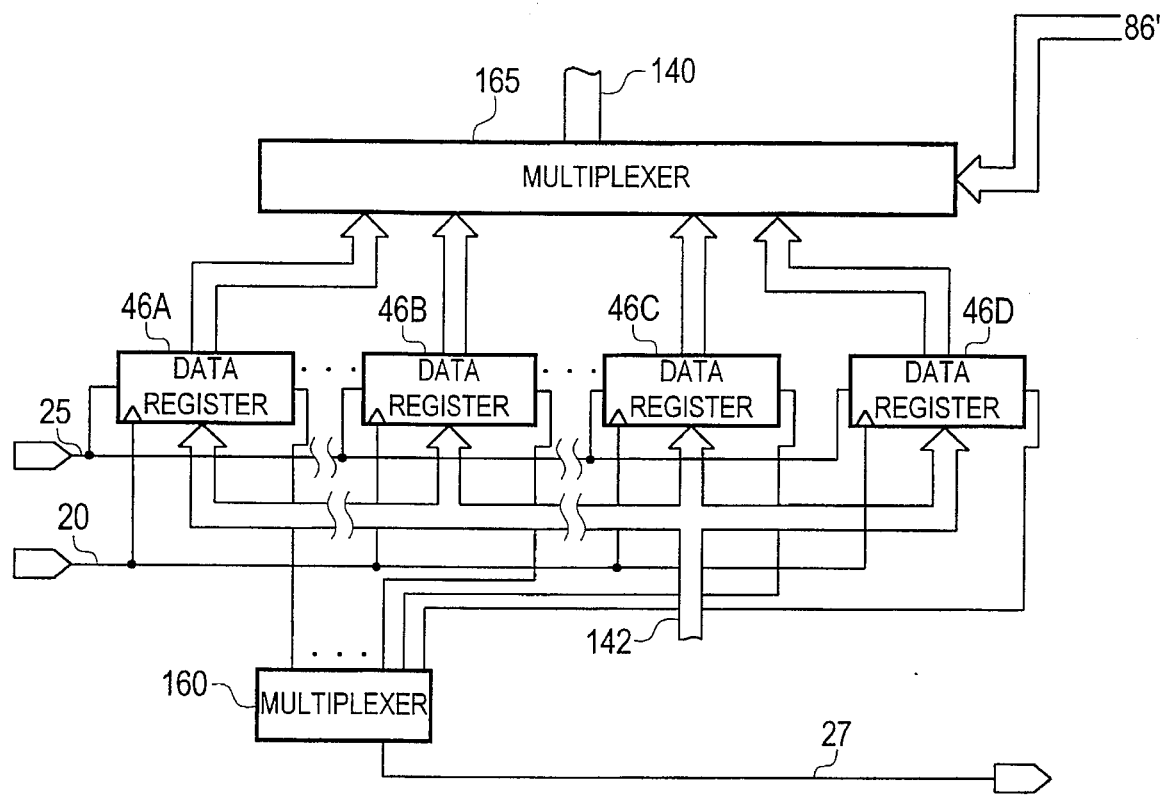
FIG. 3 shows an embodiment of the present invention in which the serial data input pin and the serial data output pin are connected to multiple data registers.

In another embodiment of the present invention, multiple data registers are provided. In that embodiment, data register 46 of FIG. 1 is replaced by a number of data registers. An example of a structure to replace data register 46 of FIG. 1 is shown in FIG. 3. These data registers are represented by data registers 46a–46d. The serial data input lead 25 is connected to the serial data input terminal of each of the data registers 46a–46d. The serial output terminals of each of the data registers 46a–46d are provided to multiplexer 160, which selects one serial data output signal among the serial data output signals of the data register 46a–46d, and couples the selected data output signal thereof to the lead 27 as the serial data output of the diagnostic circuit 10. Each of registers 46a–46d can be individually loaded with parallel input data from bus 142. Each of registers 46a–46d provides to multiplexer 165 a number of parallel output signals on a bus representing the register's content. Multiplexer 165 selects one of these output buses of registers 46a–46d to couple the data output signals thereon onto bus 140. Multiplexers 160 and 165, and each of the registers 46a–46d are controlled by a control bus 86' (only the part of control bus 86' provided to the select input terminals of multiplexer 165 is shown in FIG. 3.) The control bus 86' replaces the control lead 86 of FIG. 1.

By providing multiple data registers 46a–46d, intermediate test data can be stored in the diagnostic circuit for use in the remaining test sequence. The ability to shift into the serial data registers multiple bit patterns to be stored in multiple data registers allows the bit patterns be applied in succession to the state register 12 without pausing in between to shift in the next bit patterns. The ability to apply multiple bit patterns successively also allows the sampling of output at predetermined intervals to provide a monitor for state register 12's response time. Furthermore, if a zero-length register (i.e., a bypass path) is provided, data shifted in through the serial data input lead 25 intended for the next circuit in the cascaded series of diagnostic circuits can be shifted through the bypass path or zero-length register to the serial data output 27 with no latency. Using this zero-length register, the time required to scan data into the circuits in the scan path is minimized. Another benefit of a bypass path is the ability to complete a test sequence despite any faults discovered in intermediate components of the scan path breaking the serial scan chain. By bypassing the defective components, the remaining tests of the test sequence can complete. In the prior art, the test sequence is often aborted if the scan chain is broken by defects of the intermediate components of the scan path.

Figure 4:
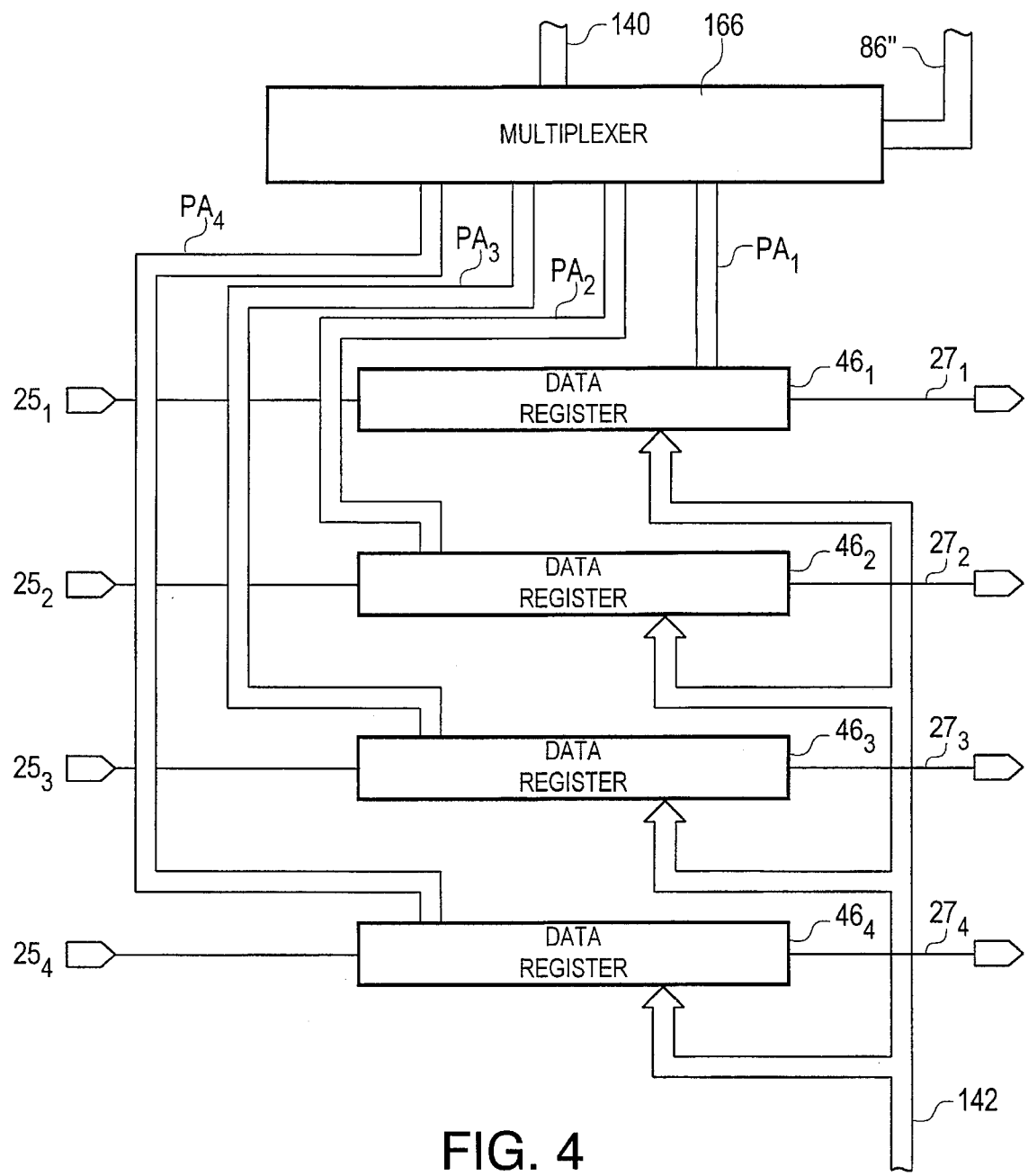
FIG. 4 shows an embodiment in accordance with the present invention using multiple serial data input and data output pins.

FIG. 4 shows data register structure in accordance with another embodiment of the present invention. In this embodiment shown in FIG. 4, in place of FIG. 1's register 46, lead 25, lead 27 and lead 86 respectively, registers $46_1$–$46_4$, input leads $25_1$–$25_4$, output leads $27_1$–$27_4$ and control bus 86" are provided.

As shown in FIG. 4, multiple serial data input leads $25_1$–$25_4$ are provided, with each serial data input lead connected to an input pin. Each of the serial data input leads $25_1$–$25_4$ is connected to the serial data input terminal of data registers $46_1$–$46_4$. Likewise, each of the serial data output terminal of data registers $46_1$–$46_4$ is individually connected to serial data output lines $27_1$–$27_4$. The parallel output bus $PA_1$–$PA_4$ respectively, of registers $46_1$–$46_4$ are provided to multiplexer 166, which selects among the parallel bus $PA_1PA_4$ and couples the signals of the selected bus thereof onto bus 140. Multiplexer 166, and data registers $46_1$–$46_4$ are each controlled by control bus 86" (only the portion of control bus 86" provided to the select inputs of multiplexer 166 is shown in FIG. 4). Under this configuration, because multiple serial data input and output pins are provided, multiple data registers of the test structure can be loaded simultaneously. This is particularly valuable if each data register of the diagnostic circuit corresponds to a separate scan path the same chip. Consequently, testing time for a chip having multiple scan paths can be greatly reduced.

The embodiments discussed hereinabove in conjunction with the drawings are intended to illustrate the specific embodiments of the present invention, and are not intended to limit the scope of the present invention. Numerous modifications and variations are possible within the scope of the present invention, which is defined by the claims set forth below.

What is claimed is:

1. A diagnostic circuit comprising:

a command input lead for receiving a first serial command signal;

a plurality of data input leads for receiving a first plurality of serial data signals;

a clock input lead for receiving a clock signal;

a control lead for receiving an external control signal, said control signal having first and second states;

a command register coupled to receive said clock signal of said clock input lead, said external control signal of said control lead and said first serial command signal of said command input lead for shifting in said first serial command signal and providing as serial output a second serial command signal when said external control signal is at said first state, said second serial command signal being the content of said command register delayed by a predetermined number of cycles of said clock signal, said command register also provides a number of command output signals in parallel, said command output signals being the current content of said command register;

a plurality of data registers each coupled to receive said clock signal of said clock input lead and one of said first plurality of serial data signals of said plurality of data input leads, for shifting in said one of said first plurality of serial data signals, and for providing as serial output a second serial data signal, said second serial data signal being the content of said data register delayed by a predetermined number of cycles of said clock signal, each data register also receiving a number of data input signals in parallel, and provides a number of data output signals in parallel;

a command output lead coupled to receive said second serial command signal;

a plurality of data output leads each coupled to receive one of said second serial data signals of said plurality of data registers.

2. A diagnostic circuit as in claim 1, further comprising means coupled to receive said external control signal of said control lead and said command output signals, for decoding said command output signals into a plurality of control signals when said external control signal transitions from said first state to said second state.

* * * * *